United States Patent
Hargreaves

(10) Patent No.: US 7,710,115 B2
(45) Date of Patent: May 4, 2010

(54) INDEPENDENT PHASE MODULATION FOR EFFICIENT DUAL-BAND 3D IMAGING

(75) Inventor: Brian Hargreaves, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 280 days.

(21) Appl. No.: 11/855,882

(22) Filed: Sep. 14, 2007

(65) Prior Publication Data

US 2009/0072827 A1    Mar. 19, 2009

(51) Int. Cl.
*G01V 3/00* (2006.01)

(52) U.S. Cl. .................. 324/309; 324/307; 324/318

(58) Field of Classification Search ......... 324/300–322; 600/407–435
See application file for complete search history.

(56) References Cited

U.S. PATENT DOCUMENTS

| | | | | |
|---|---|---|---|---|
| 4,843,322 | A | 6/1989 | Glover | 324/309 |
| 5,019,784 | A | 5/1991 | Garwood et al. | 324/307 |
| 5,923,168 | A * | 7/1999 | Zhou et al. | 324/309 |
| 6,064,205 | A * | 5/2000 | Zhou et al. | 324/309 |
| 6,400,151 | B1 * | 6/2002 | Haase et al. | 324/309 |
| 6,956,374 | B2 * | 10/2005 | Busse | 324/314 |
| 7,132,827 | B2 * | 11/2006 | Griswold et al. | 324/309 |
| 7,482,806 | B2 * | 1/2009 | Stemmer et al. | 324/307 |
| 2005/0001617 | A1 * | 1/2005 | Busse | 324/307 |
| 2005/0264287 | A1 * | 12/2005 | Griswold et al. | 324/309 |
| 2008/0129289 | A1 * | 6/2008 | Stemmer et al. | 324/309 |
| 2008/0129298 | A1 * | 6/2008 | Vaughan et al. | 324/322 |
| 2009/0021254 | A1 * | 1/2009 | Gore et al. | 324/309 |
| 2009/0072827 | A1 * | 3/2009 | Hargreaves | 324/309 |
| 2009/0115794 | A1 * | 5/2009 | Fukuta | 345/581 |

OTHER PUBLICATIONS

H. Y. Carr, "Steady-State Free Precession in Nuclear Magnetic Resonance", Physical Review, vol. 112, No. 5, pp. 1693-1701, 1958.
Haase et al., "FLASH Imaging. Rapid NMR Imaging Using Low Flip-Angle Pulses", J Magn Reson, vol. 67, pp. 258-266, 1986.
Michael L. Gyngell, "The Application of Steady-State Free Precession in Rapid 2DFT NMR Imaging: FAST and CE-FAST Sequences", Magn Reson Imaging, vol. 6, pp. 415-419, 1988.
Souza et al., "SIMA: Simultaneous Multislice Acquisition of MR Images by Hadamard-Encoded Excitation", J Comput Assist Tomogr, vol. 12, No. 6, pp. 1026-1030, 1988.
Hargreaves et al., "Independent Phase Modulation for Efficient Dual-Band 3D Imaging", Magnetic Resonance in Medicine, vol. 57, pp. 798-802, 2007.

(Continued)

*Primary Examiner*—Brij B. Shrivastav
*Assistant Examiner*—Tiffany A Fetzner
(74) *Attorney, Agent, or Firm*—Beyer Law Group LLP

(57) ABSTRACT

A method for magnetic resonance imaging (MRI) a first volume and a second volume spaced apart from the first volume is provided. The first volume is excited with a first linearly varying phase with respect to k-space. The second volume is excited with a second linearly varying phase with respect to k-space, wherein the first linearly varying phase has a different slope than the second linearly varying phase. Data in k-space is acquired line by line. The acquired data in k-space is Fourier transformed to image space. An image is formed with a first volume image and a second volume image from the transformed data. Use of phase modulation allows imaging with a reduced field-of-view, which can result in faster scan times or improved performance of parallel imaging acquisition strategies.

20 Claims, 8 Drawing Sheets

OTHER PUBLICATIONS

Hargreaves et al., "New Aspects on Pulse Sequence Design for Breast MRI", Eur Radiol, 16 (Suppl 5), E35-E37, 2006.

Hargreaves et al., "Independent Phase Modulation for Dual-Slab 3D Imaging", ISMRM 15th Scientific Meeting, p. 1675, May 2007.

* cited by examiner

INDEPENDENT PHASE MODULATION FOR EFFICIENT DUAL-BAND 3D IMAGING

FEDERALLY-SPONSORED RESEARCH OR DEVELOPMENT

This invention was made with Government support under contracts EB002524, HL075803, RR009780, and CA066785 awarded by the National Institutes of Health. The Government has certain rights in this invention.

BACKGROUND OF THE INVENTION

This invention relates generally to magnetic resonance imaging (MRI). Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

U.S. Pat. No. 4,843,322 to Glover, issued Jun. 27, 1989 discloses a method for producing multi-slice MRI images.

SUMMARY OF THE INVENTION

In accordance with the invention, a method for magnetic resonance imaging (MRI) a first volume and a second volume spaced apart from the first volume is provided. The first volume is excited with a first linearly varying phase with respect to k-space. The second volume is excited with a second linearly varying phase with respect to k-space, wherein the first linearly varying phase has a different slope than the second linearly varying phase. Data in k-space is acquired line by line. The acquired data in k-space is Fourier transformed to image space. An image is formed with a first volume image and a second volume image from the transformed data.

In another manifestation of the invention a magnetic resonance imaging apparatus is provided. A magnetic resonance imaging excitation and detection system is provided. A controller is electrically connected to the magnetic resonance imaging excitation and detection system. The controller comprises a display, at least one processor, and computer readable media. The computer readable media comprises computer readable code for exciting a first volume with a first linearly varying phase with respect to k-space, computer readable code for exciting a second volume with a second linearly varying phase with respect to k-space, wherein the first linearly varying phase has a different slope than the second linearly varying phase, computer readable code for acquiring data in k-space line by line, computer readable code for Fourier transforming the acquired data in k-space to image space, computer readable code for forming an image with a first volume image and a second volume image from the transformed data, and computer readable code for displaying the image on the display.

The invention and objects and features thereof will be more readily apparent from the following detailed description and appended claims when taken with the drawings.

DETAILED DESCRIPTION OF ILLUSTRATED EMBODIMENTS

Certain applications of MRI, such as bilateral breast imaging, require simultaneous imaging of multiple volumes. Although image data can be acquired sequentially, the signal to noise ratio (SNR) is often improved if both slabs are excited and imaged together, typically with phase encoding across a volume including both slabs and the space between them. The use of independent phase modulation of multiple slabs eliminates the need to encode empty space between slabs, which can result in a significant time reduction. Each slab is excited with a phase proportional to phase-encode number such that the slat) positions in the acquired data are shifted to reduce empty space. With careful consideration this technique is compatible with different pulse sequences (e.g., spin-echo, gradient-echo, RF spoiling, and balanced SSFP (bSSFP) and acceleration strategies (e.g., partial k-space and parallel imaging).

Figure 1:
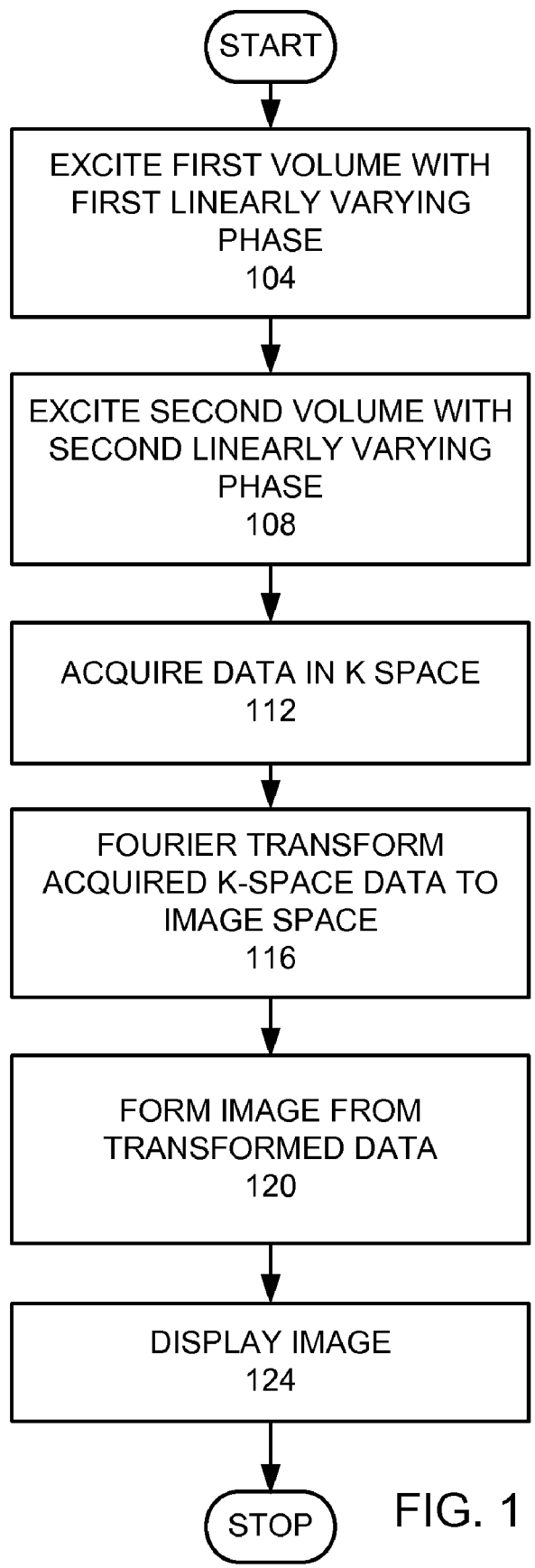
FIG. 1 is a high level flow chart of an embodiment of the invention.

To facilitate understanding, FIG. 1 is a high level flow chart of an embodiment of the invention. A first volume is excited with a first linearly varying phase (step 104). A second volume is excited with a second linearly varying phase (step 108). The first lineally varying phase has a different slope than the second linearly varying phase. One, but not both, of the linearly varying phases may have a slope of zero. Data is acquired in k-space line by line (step 112), such that the excited phase in each volume varies linearly with k-space line (with different slopes). The acquired data is Fourier transformed to image space (step 116). An image is formed from the transformed data (step 120), The image is displayed (step 124).

Numerous applications of magnetic resonance imaging (MRI) benefit from imaging of multiple 3D volumes. Examples include bilateral breast imaging and imaging, of the lower extremities or specific organs, such as kidneys. As with 3D imaging compared to multislice imaging, simultaneous excitation of all volumes can improve the SNR of the acquisition compared to sequential imaging of each volume. However, in many applications the volumes are separated in the phase-encode direction, which means that simultaneous imaging requires encoding across both the volumes of interest and the space between them. An embodiment of the invention provides a simple, robust technique that allows one to image multiple volumes without having to encode the space between. The result is a more time-efficient approach to multislab imaging.

Additionally, the increased use of parallel imaging in MRI directly benefits from this technique. For sensitivity-encoded (SENSE) methods, the use of different phase modulation for each slab allows reduced artifact levels by avoiding the case where one slab boundary overlaps with the central portion of another slab. Alternative data-driven parallel imaging methods such as generalized autocalibrating partial parallel acquisition (GRAPPA) cannot easily be formulated for separate volumes. However, the approach described here allows such formulation, which will enable GRAPPA and similar methods, which often perform better in practice than SENSE methods.

Figure 2:
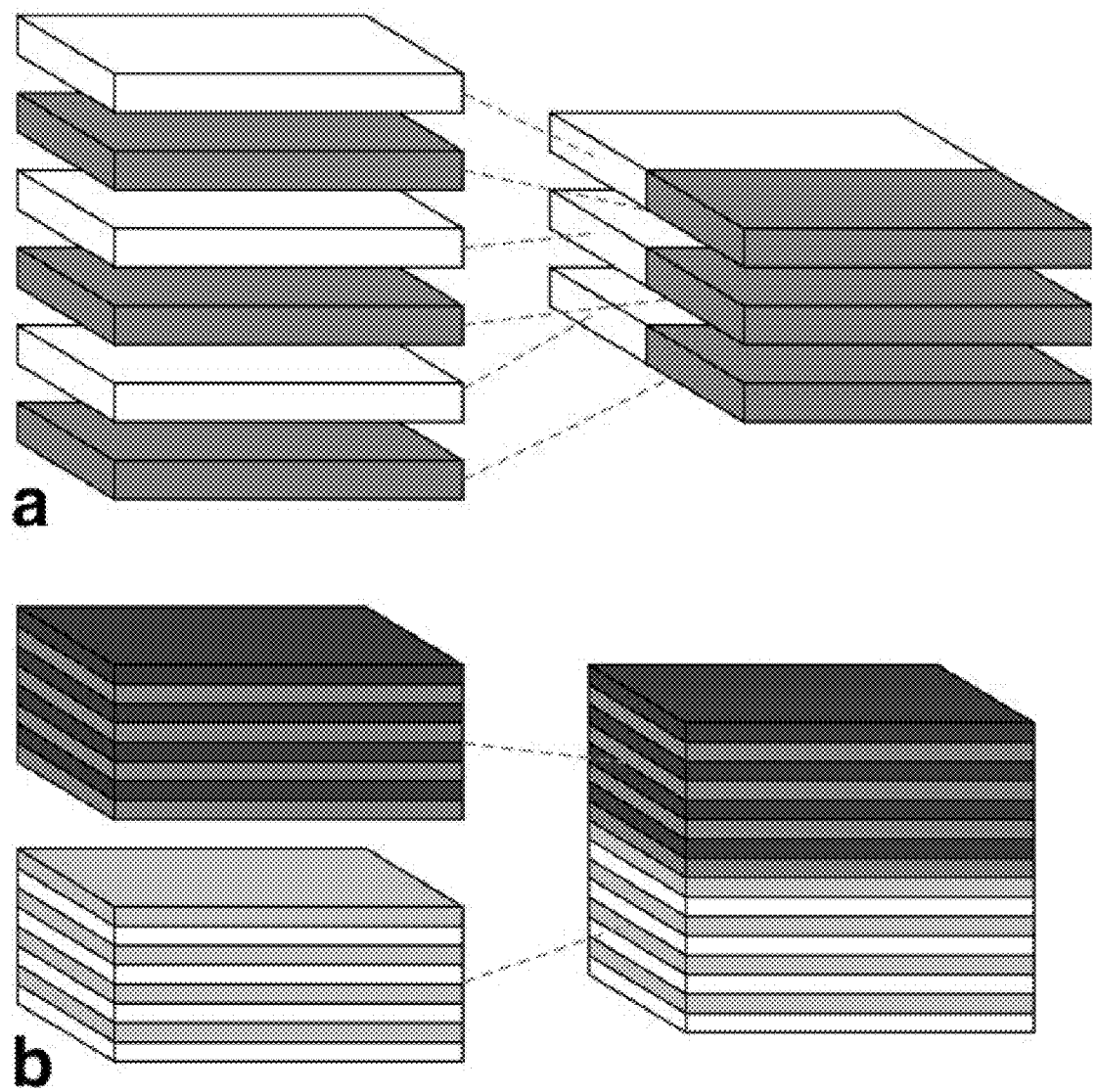
FIGS. 2a-b are schematic illustrations of differences between phase-offset multiplanar (POMP) imaging and phase modulation for 3D slab shifting.

An embodiment of the invention uses independent excitation of individual slabs. A different linear phase modulation is used in each slab to shift the signal from both (or all) slabs to eliminate empty space between. This reduces the required imaging field of view (FOV) to the sum of the FOVs of the individual slabs. FIGS. 2a and b schematically illustrate differences between phase-offset multiplanar (POMP) imaging and phase modulation for 3D slab shifting FIG. 2a schematically shows a phase modulation for 3D slab shifting. FIG. 2b shows a slab-direction extension of POMP imaging, in which individual slices are phase-modulated to offset the FOV in the in-plane direction. The implementation described here is designed for dynamic contrast-enhanced (DCE) breast imaging to rapidly and simultaneously acquire images over two separate volumes.

Theory

This section begins with standard considerations regarding the slab-selection profile, FOV, and section thickness, and then discuss the effect of phase modulation in k-space and how this can be used to reduce the acquired FOV when multiple slabs are imaged simultaneously. It is assumed that the z direction is the slab-selective direction throughout this discussion.

Standard Slab Considerations

Figure 3:
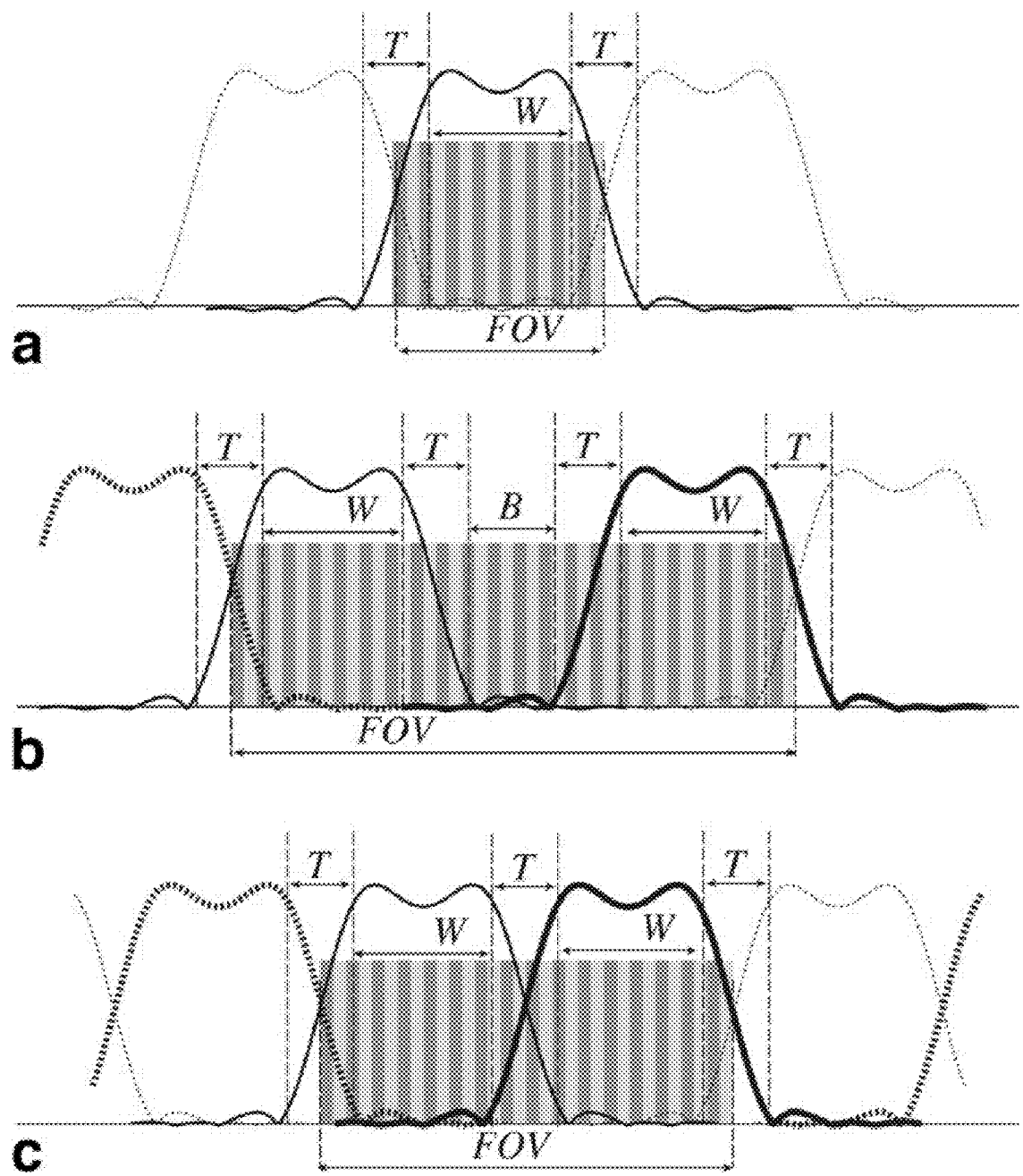
FIGS. 3a-c are schematic illustrations of field of views of different imaging processes.

The case of standard 3D slab-selective imaging is shown in FIG. 3a. A fairly rough excitation profile is shown by the solid black line. The transition width. T is the portion of the profile in which the excited signal is high enough to interfere but low enough to not provide the desired flip angle. The usable width, W, is the region of the pulse where the desired flip angle is achieved. If the FOV is chosen (gray sections) to cover a width W+T, then aliased replicas of the profile (dotted lines) will not interfere significantly with the usable sections over width W.

Dual-Slab Considerations

The case of simultaneous dual-slab imaging is shown in FIG. 3b. Two slabs are excited (solid lines) with a nonexcited space between them of B, requiring a total encoded FOV of 2W+3T+B. Although pulse profiles are usually sharper than those shown in FIG. 3b, a significant amount of time is spent encoding unusable sections where the flip angle is inadequate or there is aliasing from the transition bands.

In FIG. 3c the slabs are minimally separated, such that the transition bands overlap exactly. Here the imaging, FOV must support 2W+2T, a savings of B+T compared to FIG. 3b. This represents the most efficient case for dual-slab imaging. The following sections describe how phase modulation can be used to achieve this case regardless of the slab positions.

Phase Modulation

It is well known that a linear phase modulation in k-space results in a shift in image space, Consider the case of FIG. 3a, where N sections are imaged with a section thickness $\Delta z$. Increasing the receiver phase by $\Delta \phi = 2\pi n/N$ on each phase encode results in a circular shift of the image by n sections, or a distance $n\Delta z$. Although this shift is usually applied after the data are received, a linear phase modulation can instead be applied during the excitation.

Dual-Slab Phase Modulation

For dual-slab imaging 2N sections were acquired to cover two slabs, with the same section thickness $\Delta z$ as above. The goal is to image the case of FIG. 3b with the encoding FOV of FIG. 3c, which requires shifting the slabs together by T+B. The slabs can be shifted together by selecting opposite $n = \pm (T+B)/2\Delta z$, which results in independent phase increments of $\Delta \phi = \pm (T+B)/(N\Delta z)$.

The temporal effect of slab phase modulation requires careful thought. For example, if the $k_z$ phase-encode loop is the innermost loop, then the increment $\Delta \phi$ should be chosen such that $2N\Delta\phi$ will be a multiple of $2\pi$ and the temporal phase increment will always be linear. This topic is covered in greater detail below.

Materials and Methods

Independent slab phase modulation in 3D pulse sequences designed for bilateral breast imaging, using standard 3D Cartesian imaging and 3D "stack-of-spirals" imaging was demonstrated. The excitation used a dual-band spectral spatial excitation pulse that interleaves spatial RF lobes for left and right slabs to allow independent shimming of each slab. An oscillating phase waveform whose amplitude can be changed with each excitation simultaneously provided phase modulation for both slabs.

All images were obtained on a GE Excite 12.0 scanner with a 40-mT/m maximum gradient amplitude and 150-mT/m/ms maximum slew rates (GE Healthcare, Waukesha, Wis., USA), Cartesian images were reconstructed online, and a custom spiral reconstruction was used offline. A sum-of-squares (SOS) reconstruction was used to combine multicoil images.

Phantom Validation

For the initial validation a dual-cylinder resolution phantom and an eight-channel breast coil (GE Healthcare, Waukesha. WI. USA) was used. A 3D Cartesian readout was used with 512×128 matrix over a 20-cm FOV (in-plane) and 96 sections (each 4 mm thick) with a 30° flip angle and RF-spoiled acquisition. Phase encoding in the slab direction formed the innermost loop in the acquisition (i.e., all $k_z$ values for the first $k_y$ line were acquired before moving to the second $k_y$ line).

Figure 4:
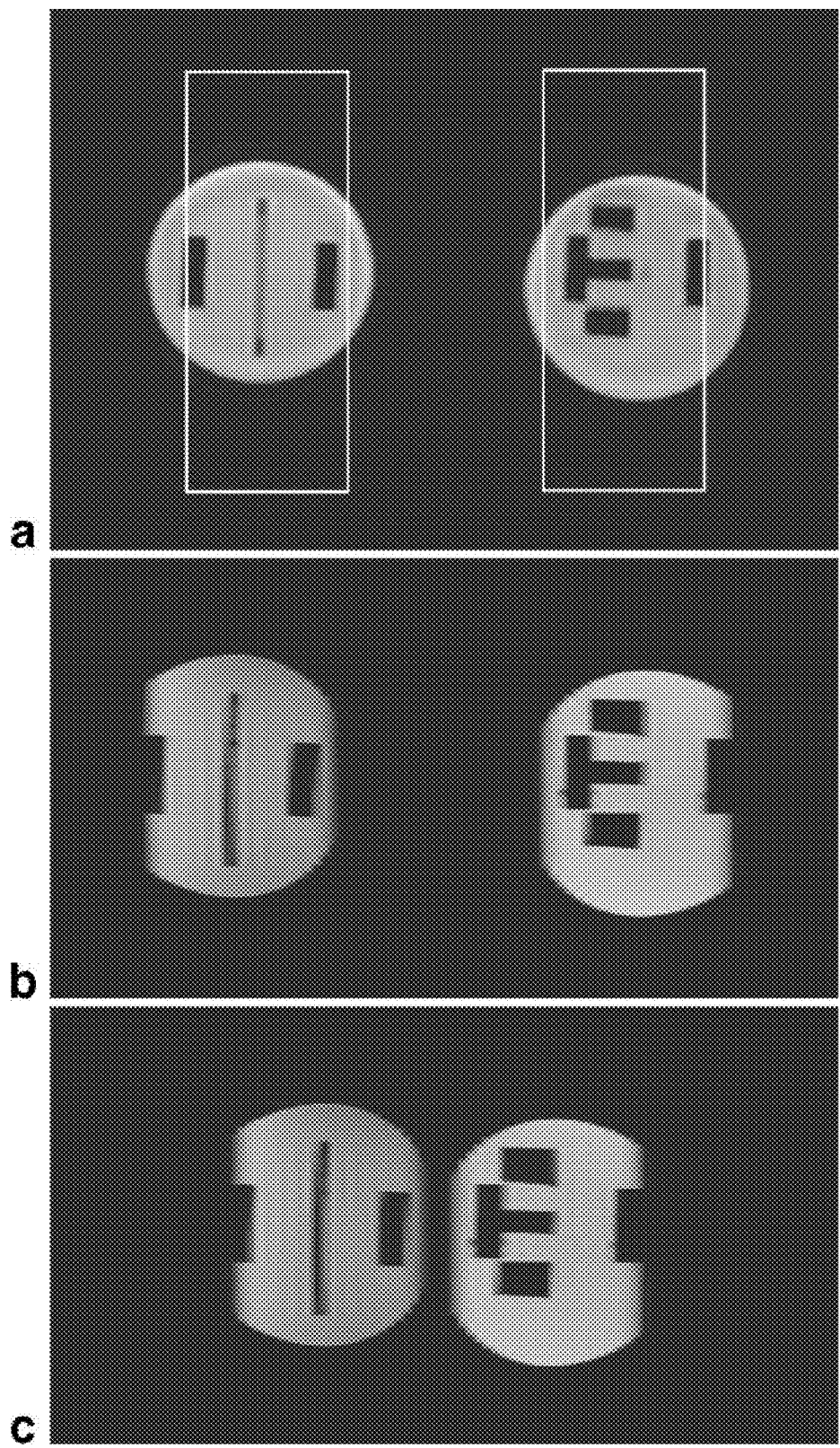
FIGS. 4a-c show the results of a phantom demonstration.

The scan prescription allowed selection of the two excited slabs from a localizer, as shown in FIG. 4a. After the volume and slabs were selected, the scan was performed by phase encoding a total volume that included both slabs and the space between them. The scan was then repeated with the same parameters except for the addition of independent phase modulation to effectively shift the slabs together. Although the goal is to reduce the FOV, the same FOV was used for both scans in this demonstration. Images were reformatted to show the same plane as in the localizer scan.

In Vivo Examples

Two modifications were made to apply the above sequence to 3D bilateral breast imaging. First, the imaging, FOV was reduced to include only the excited slabs (which is the goal of this method). Second, after reconstruction was performed, the locations were corrected to the actual values to obtain two separate volumes. Two healthy volunteers were scanned and five patients with suspected lesions. All of the subjects gave informed consent according to the guidelines of our institution. Independent phase modulation was used for both rapid DCE imaging and static high-resolution imaging. For both pulse sequences an eight channel breast coil (GE Healthcare) with a simple SOS combination was used in reconstruction. A $T_1$-weighted multislice spin-echo localizer scan was used to select a 3D slab) over each breast.

The static imaging sequence used a 512×192 (artesian readout, ±16 kHz bandwidth. 20-cm FOV in-plane, and 128 sagittal 3D sections (each 1.5 mm thick). A partial $k_y$ reconstruction with 112 of 192 lines was used. Independent phase modulation was applied to bring together the two slabs in a water-only, dual-band spectral-spatial excitation. With a resulting TR of 30 ms, the total scan time for this technique was 7 min 10 s.

The rapid sequence used eight spiral interleaves inplane to cover a 20-cm FOV with 1.2-mm resolution, similarly to previous DCE imaging sequences used for breast imaging. A partial k-space acquisition with 40 of 64 phase-encode planes collected in a third (sagittal) direction, and a homodyne reconstruction were used for a total scan time of 10 s per 3D volume. Again the $k_z$ loop formed the innermost loop. A section thickness of 3 mm with independent phase modulation of each slab (the same excitation used in the static sequence) was selected.

Results

Phantom Validation

FIGS. 4a-c show the results of the phantom demonstration with the prescribed volume (FIG. 4a), and orthogonal slices from the 3D reconstruction showing the slab positions without FIG. 4b) and with (FIG. 4c) phase modulation. Note that the slabs in FIGS. 4b and c are identical in appearance, but the positions are different. This experiment demonstrates that independent modulation of slab phase can image the geometry of FIG. 3b with the scheme of FIG. 3c.

In Vivo Examples

Figure 5:
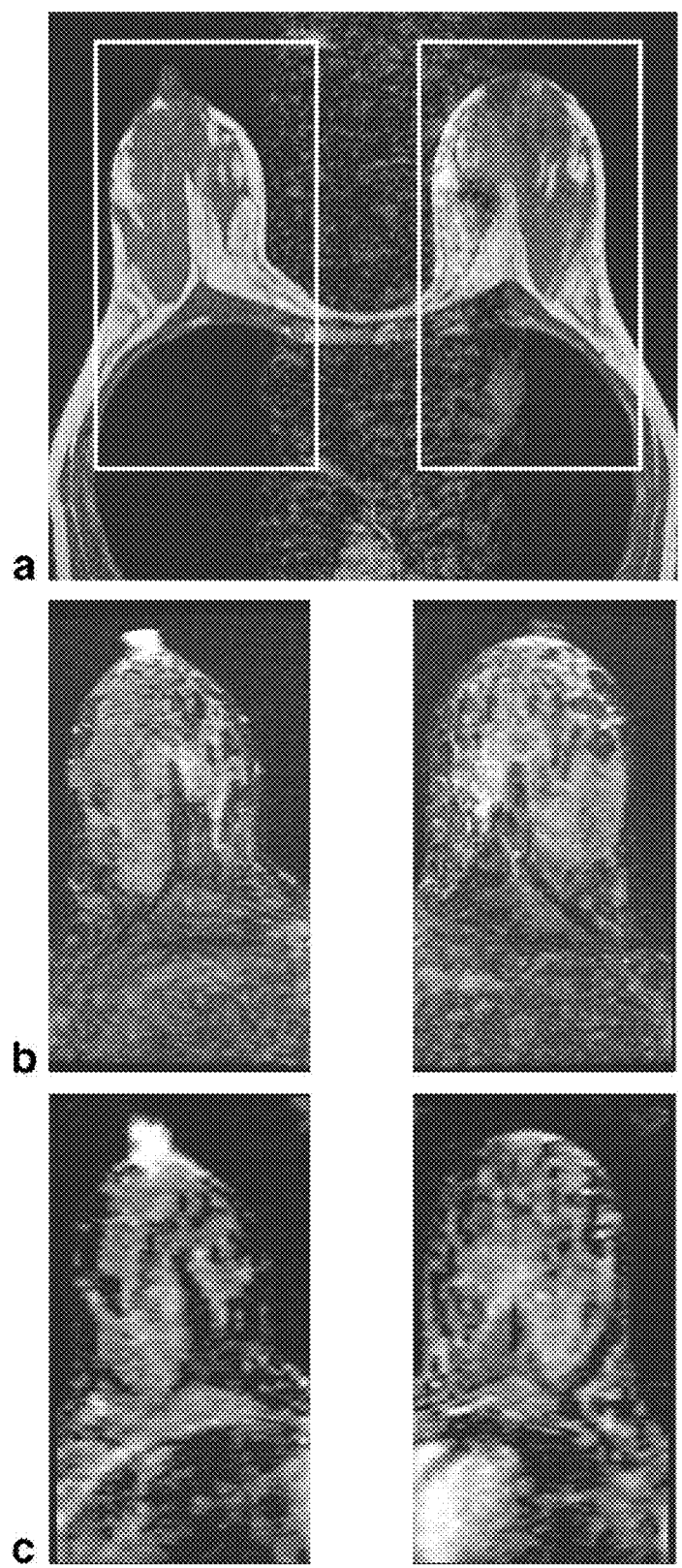
FIGS. 5a-c show a $T_1$-weighted localizer scan and examples of static 3D Cartesian and dynamic 3D spiral bilateral breast images using independent phase modulation with a dual-band water-only excitation.

FIGS. 5a-c show a $T_1$-weighted localizer scan and examples of static 3D Cartesian and dynamic 3D spiral bilateral breast images using independent phase modulation with a dual-band water-only excitation. In this case a scan-time savings of about 20% was achieved by not encoding the central portion between the breasts. Pulsatility artifacts from cardiac motion result in smearing in the left-right direction in the Cartesian images, but no artifact is introduced by phase-modulated slab shifting. The additional use of partial k-space in the 3D spiral images was combined with phase modulation without any significant ringing artifacts in the left-right direction.

Discussion

Independent phase modulation of multiple slabs is a simple technique that shifts slabs together in the acquired image and thus eliminates the need to phase-encode across empty space between slices. This technique was demonstrated in phantoms and in two different 3D sequences in seven subjects. In this section some considerations of this technique in further detail is discussed.

Excitation Pulses

The present results were all obtained with the use of a dual-band, water-only excitation. This pulse is designed to allow independent shimming of two 3D slabs for robust fat suppression. Independent phase modulation is possible because the two slabs are excited in a time-multiplexed manner. Similarly, two simple slab-selective excitations applied in rapid sequence would allow independent phase modulation during excitation. Hadamard-type excitations can also be used, with increasing complexity, such an excitation is described in Souza S P. Szumowski J. Dumoulin C L, Plewes D P, Glover G. SIMA: simultaneous multislice acquisition of MR images by Hadamard-encoded excitation, J Comput Assist Tomogr 1988; 12:1026-1030, which is incorporated by reference.

Steady-State Considerations

In contrast to the typical case in which the data phase is modulated in the receiver, excitation phase modulation actually affects the magnetization itself. In non-steady-state cases, such as spin echo and rapid acquisition with relaxation enhancement (RARE), the order of acquisition with excitation phase modulation is not important. Common fast RF-spoiled gradient-echo, as described in Haase A, Frahm J, Matthaei D, Hanicke W, Merboldt K D. FLASH imaging. Rapid NMR imaging using low flip-angle pulses, J Magn Reson 1986; 67:258-66, which is incorporate by reference, and gradient-spoiled, as described in Gyngell ML. The application of steady-state free precession in rapid 2DFT NMR imaging: FAST and CE-FAST sequences. Magn Reson Imaging 1988; 6:415-419, which is incorporated by reference, sequences are unaffected by a linear phase increment on each repetition. In most cases the phase modulation can be chosen to be linearly increasing in time, as described below, Balanced steady-state free precession (bSSFP), as described in Carr H Y. Steady-state free precession in nuclear magnetic resonance. Phys Rev 1958; 112:1693-1701, which is incorporated by reference, can be implemented with a linear phase increment $\Delta\phi$ on each repetition. Although this shifts the frequency profile by a frequency of $\Delta\phi/(2\pi TR)$, the excitation frequency can be modified to compensate for that shift, resulting in a very small additional slab shift that effectively quantizes the allowable slab positions.

Acquisition Order Considerations

Although other excitation phase-ordering schemes exist, a linearly increasing excitation phase guarantees that a gradient-spoiled, RF-spoiled, or fully balanced steady-state will be maintained. Thus, for phase-modulated slab shifting, there are two constraints: 1) the phase of each spin must be linearly incremented with the excitation number, and 2) the phase of each slab must increase linearly with the k number.

These constraints can be met for most pulse sequences. For example, for 3D Cartesian scanning, if a total of $N_z$ phase encodes in the 1 direction form the innermost loop, then we require $N_z\Delta\phi$ to be a multiple of $2\pi$. Note that this also applies to partial $k_z$ acquisitions, where $N_z$ is the total member of acquired phase encodes. If instead the phase encoding in y forms the innermost loop, an increment of $\Delta\phi/N_y$ on each $k_z$ phase encode will ensure that both constraints can still be met, at the cost of a very small shift in the y direction.

Parallel Imaging

For cases in which coil sensitivities can be exploited to separate multiple slabs, parallel imaging, is a very appropriate way to accelerate imaging. In practice, as parallel imaging hardware and algorithms develop, there will be ultimately be few cases with separate volumes where parallel imaging is not used. Parallel imaging can also eliminate the need to encode empty space. However, coil-sensitivity information must still be acquired with these methods, so that a time savings will still result if independent phase-modulation is used to acquire coil sensitivity information. Furthermore, one can use independent phase modulation to shift slabs in a second direction to reduce residual aliasing in parallel imaging in a manner similar to that of control led aliasing techniques for multislice imaging.

A more important benefit is seen when sensitivity encoding (SENSE) methods are used to separate two slabs. If the FOV is set equal to one slab. SENSE can, in principal be used to separate the two slabs. However, with standard SENSE, the two slabs will not necessarily overlap perfectly, often leading to the case where the edge of one slab overlaps the central portion of the other. There are two problems here. First, the estimation of coil sensitivity is poor at slab edges, which can lead to artifacts in the central portion of both slabs wherever the other slab edge has wrapped. Second, the coil sensitivity profiles are often smoothed, so that having a discontinuity in the central pant of the image may cause problems. By using an embodiment of the invention in parallel imaging discontinuities caused by parallel imaging may be removed. Thus, an embodiment of the invention may be used with parallel imaging processes such as SENSE or temporal SENSE (TSENSE).

A different benefit is possible with parallel imaging methods that attempt to directly fill in missing k-space lines, such as generalized autocalibrating partial parallel acquisition (GRAPPA) or simultaneous multiple acquisition using spatial harmonics (SMASH). Here, the algorithm cannot easily be formulated for separate slabs, and additional FOV may need to be synthesized resulting in unnecessarily higher acceleration factors and increased noise. When phase modulation is used, methods such as GRAPPA or SMASH may be easily included without modification. Additionally, fewer calibration lines are needed when the minimum FOV is synthesized. Thus, an embodiment of the invention may be instead used with parallel imaging processes such as GRAPPA or SMASH.

Multiple Slabs

It is simple to extend this technique to image more than two slabs. To image M slabs, the appropriate shift for each slab was calculated so that the encoded FOV will support a width M(W+T), and then apply this shift during the excitation. The slab width for each volume need not be identical as long as the shifts take into account the transition widths of the slab profiles. In addition, one could apply the phase modulation in more than one phase-encode direction to bring multiple slabs together in more than one direction.

CONCLUSIONS

Independent phase modulation of dual-slab excitation sequences allows simultaneous acquisition of multiple volumes without the need to image the non-excited volume between slabs. This technique was applied to bilateral breast imaging and achieved moderate (20-30%) reductions in scan times. The technique is applicable for any protocol in which multiple noncontiguous volumes are imaged simultaneously.

Figure 6:
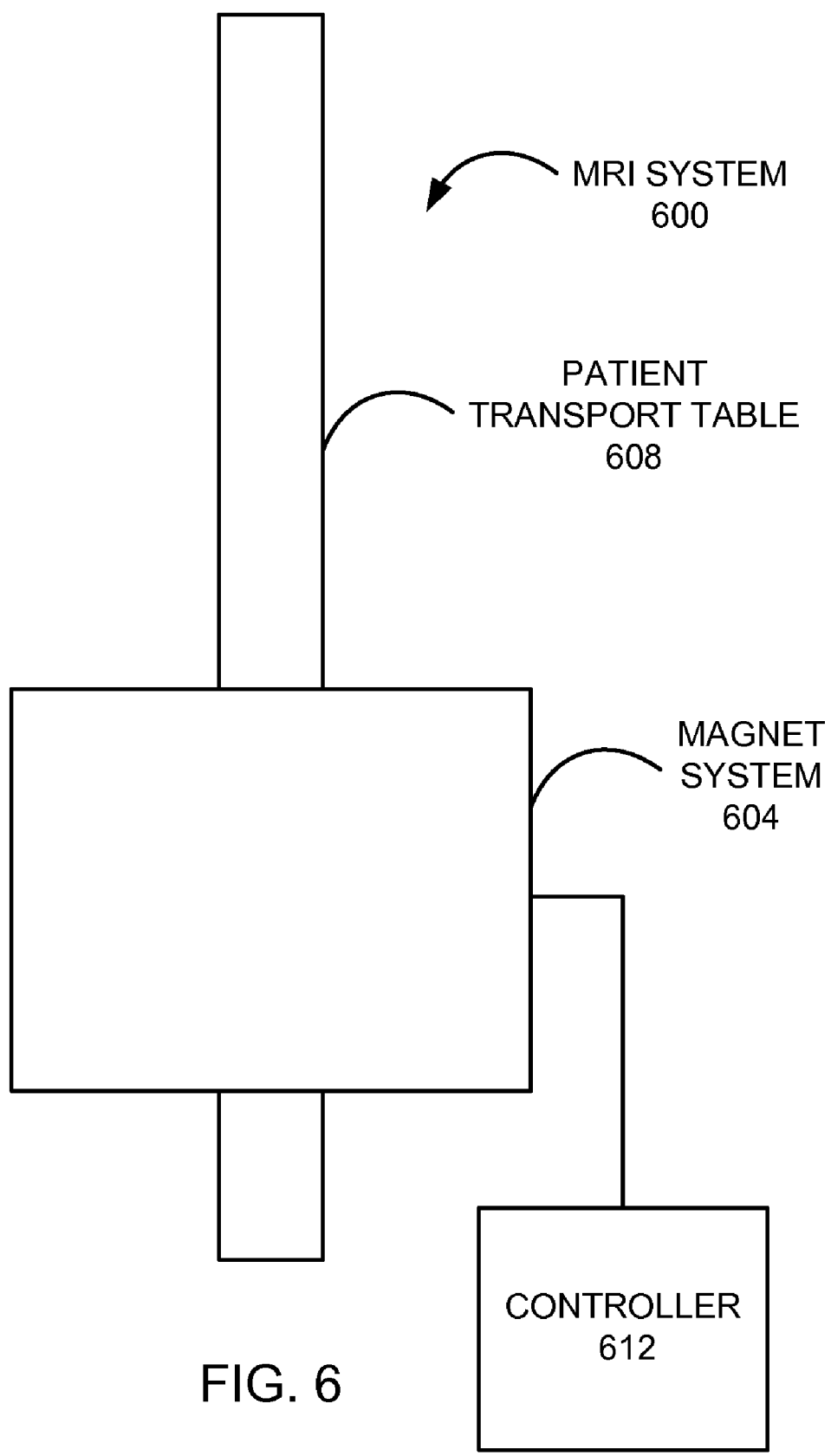
FIG. 6 is a schematic top view of a magnetic resonance imaging (MRI) system that may be used in an embodiment of the invention.

FIG. 6 is a schematic top view of a magnetic resonance imaging (MRI) system 600 that may be used in an embodiment of the invention. The MRI system 600 comprises a magnet system 604, a patient transport table 608 connected to the magnet system, and a controller 612 controllably connected to the magnet system. In one example, a patient would lie on the patient transport table 608 and the magnet system 604 would pass around the patient. The controller 612 would control magnetic fields and radio frequency (RF) signals provided by the magnet system 604 and would receive signals from detectors in the magnet system 604. In one embodiment, the magnet system 604 would use a single excitation coil to excite the first volume and the second volume. In another embodiment, the magnet system 604 would use multiple excitation coils to excite the first volume and the second volume. In either single or multiple excitation coil embodiments, the volumes could be excited in rapid succession by separate pulses. Alternatively, in a different embodiment, a set of radio frequency pulses using a cosine modulation may be used to provide the linearly varying phase. In another single or multiple excitation coil embodiment, a set of radio frequency pulses using a Shinnar-LeRoux pulse design may be use to provide the linearly varying phases.

Figure 7A:
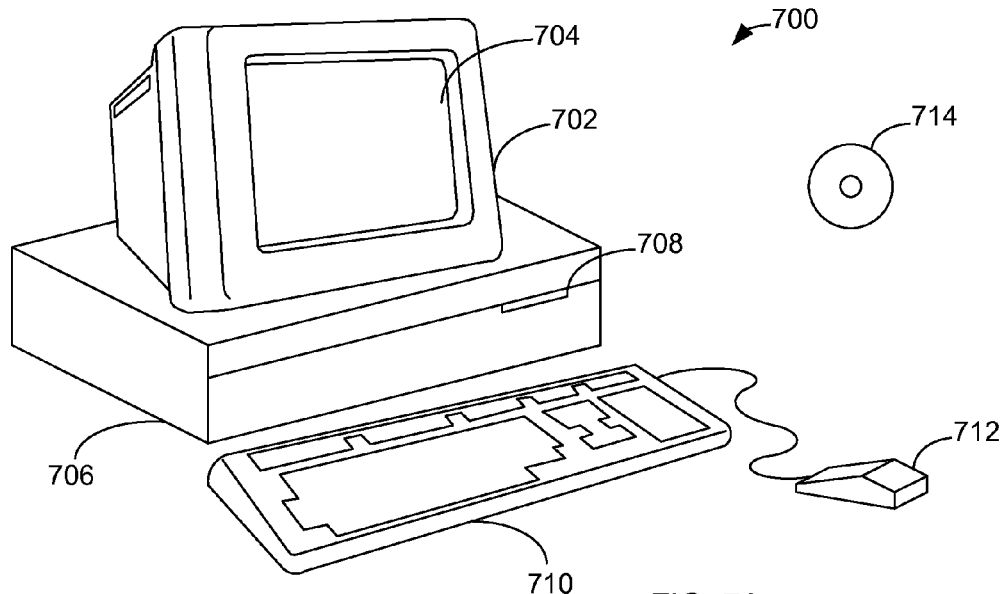
FIGS. 7A and 7B illustrate a computer system that may be used in an embodiment of the invention.
Figure 7B:
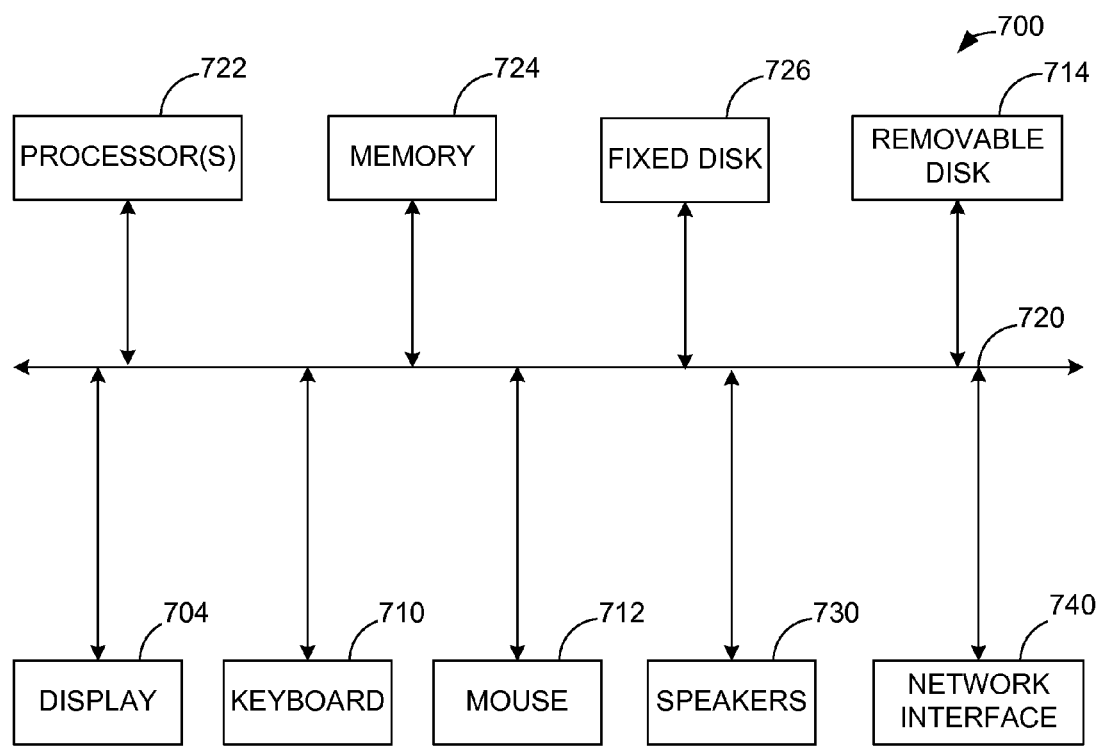

FIGS. 7A and 7B illustrate a computer system 700, which is suitable for implementing a controller 612 used in embodiments of the present invention. FIG. 7A shows one possible physical form of the computer system. Of course, the computer system may have many physical forms ranging from an integrated circuit, a printed circuit board, and a small handheld device up to a huge super computer. Computer system 700 includes a monitor 702, a display 704, a housing 706, a disk drive 708, a keyboard 710, and a mouse 712. Disk 714 is a computer-readable medium used to transfer data to and from computer system 700.

FIG. 7B is an example of a block diagram for computer system 700. Attached to system bus 720 are a wide variety of subsystems. Processor(s) 722 (also referred to as central processing units, or CPUs) are coupled to storage devices, including memory 724. Memory 724 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 726 is also coupled bi-directionally to CPU 722; it provides additional data storage capacity and may also include any of the computer-readable media described below. Fixed disk 726 may be used to store programs, data, and the like and is typically a secondary storage medium (such as a hard disk) that is slower than primary storage. It will be appreciated that the information retained within fixed disk 726 may, in appropriate cases, be incorporated in standard fashion as virtual memory in memory 724. Removable disk 714 may take the form of the computer-readable media described below.

CPU 722 is also coupled to a variety of input/output devices, such as display 704, keyboard 710, mouse 712, and speakers 730. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 722 optionally may be coupled to another computer or telecommunications network using network interface 740. With such a network interface, it is contemplated that the CPU might receive information from the network, or might output information to the network in the course of performing the above-described method steps. Furthermore, method embodiments of the present invention may execute solely upon CPU 722 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 612 may be used to generate and then display an image on the display 704.

Figure 8:
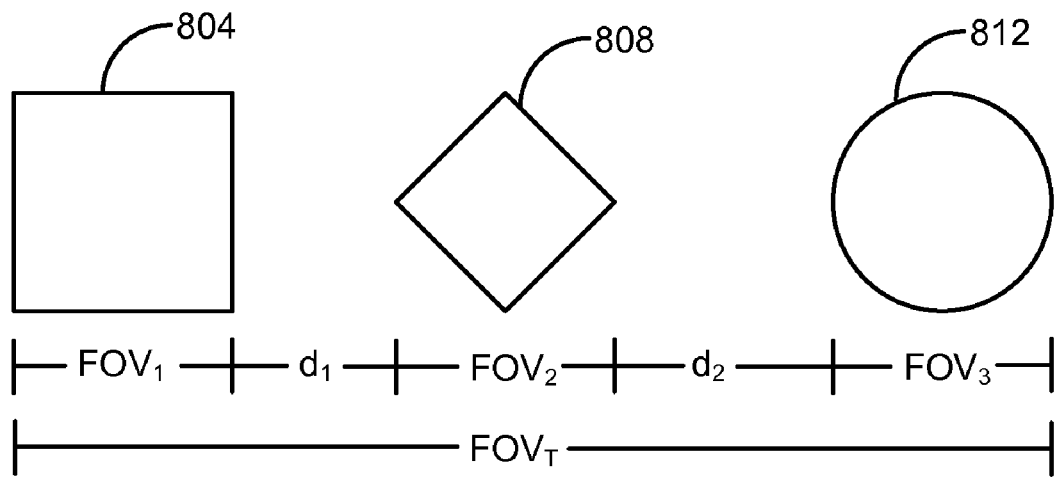
FIG. 8 is a schematic illustration of volumes that are scanned using an embodiment of the invention.

FIG. 8 is a schematic illustration of volumes 804, 808, 812 that are scanned using an embodiment of the invention. The first volume 804 has a first field of view $FOV_1$, the second volume 808, has a second field of view $FOV_2$, and the third volume 812 has a third field of view $FOV_3$. The first volume 804 and the second volume 808 are separated by a first distance $d_1$. The second volume 808 and the third volume 812 are separated by a second distance $d_2$. A total field of view $FOV_T$ would be the sum of the first field of view, the second field of view, the third field of view, the first distance and the second distance:

$$FOV_T = FOV_1 + FOV_2 + FOV_3 + d_1 + d_2$$

In nonshifted example a $\Delta k_n$ is used, where $\Delta k_n = 1/FOV_T$.

In this embodiment, a first linearly varying phase with respect to k-space is used to excite the first volume 804 (step 104), a second linearly varying phase with respect to k-space is used to excite the second volume 808 (step 108), and a third linearly varying phase with respect to k-space is used to excite the third volume 812. The linearly varying phases may be represented by the equations:

$$\phi_1(k) = ak, \phi_2(k) = bk, \text{ and } \phi_3(k) = ck.$$

Figure 9:
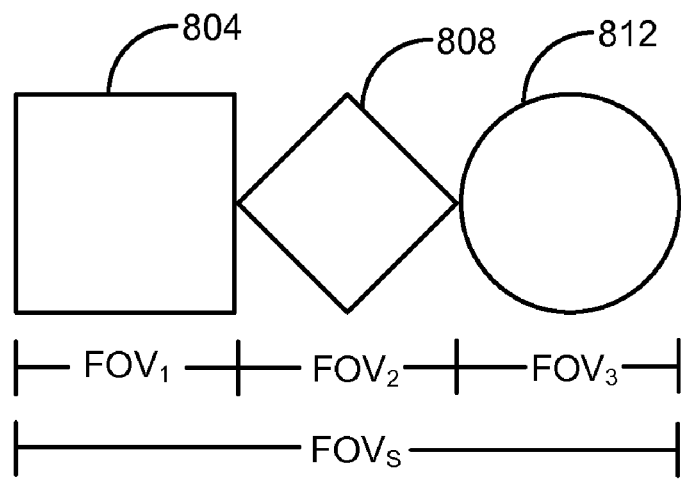
FIG. 9 is a schematic illustration of how linearly varying excitation is used to move the volumes together in k-space.

To move the first volume the distance $d_1$ to the second volume, b may be set to zero and $a = 2\pi d_1/FOV_S$. To move the third volume the distance $d_2$, $c = 2\pi d_2/FOV_S$. So the difference in slopes of the linearly varying phase determines the distance that the volumes are shifted. Note that the sign of these slopes may be reversed by many different aspects of the implementation, and must be chosen carefully. Such an excitation moves the volumes together in k-space, as schematically illustrated in FIG. 9. The shifted volumes are acquired with a reduced, "shifted" field of view $FOV_S$, which is the sum of the first field of view, the second field of view, and the third field of view, and which is not dependent on the first distance and second distance.

$$FOV_S = FOV_1 + FOV_2 + FOV_3.$$

As can be seen in FIG. 8 and FIG. 9, $FOV_T$ is greater than $FOV_S$, since $FOV_T$ includes $d_1$ and $d_2$, where $FOV_S$ is not dependent on $d_1$ or $d_2$. Since $\Delta k_S = 1/FOV_S$, the shifted field of view $FOV_S$ can be scanned much quicker allowing for fast MRI imaging. Since $FOV_S$ is not dependent on the separation distances over which the volumes are shifted, $\Delta k_S$ is not dependent on the separation distances over which the volumes are shifted.

An embodiment of the invention especially improves scan times for bilateral volumes separated by a distance. In addition to breasts, kidneys, lungs, and arms have such volumes. Knees have such volumes without the separation.

In one embodiment, the volumes may be identical to each other, such as in bilateral breast imaging. In another embodiment, the first volume may be different than the second volume, as could occur in patients with breast reconstruction resulting in different sized breasts.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for magnetic resonance imaging (MRI) a first volume and a second volume spaced apart from the first volume in physical space, comprising:
   a) exciting the first volume with a first linearly varying phase with respect to k-space;
   b) exciting the second volume with a second linearly varying phase with respect to k-space, wherein the first linearly varying phase has a different slope than the second linearly varying phase;
   c) acquiring data in k-space line by line;
   d) Fourier transforming the acquired data in k-space to image space; and
   e) forming an image with a first volume image and a second volume image from the transformed data.

2. The method, as recited in claim 1, wherein the first volume forms a first field of view and the second volume forms a second field of view wherein the first field of view and the second field of view are spaced apart by a physical distance d, wherein the acquired k-space data has a k-space spacing $\Delta k$ that is not dependent on the physical distance d.

3. The method, as recited in claim 2, wherein the first volume image and the second volume image are effectively shifted together by a distance dependent on the physical distance d.

4. The method, as recited in claim 3, wherein the amount of shifting of the images is dependent of a difference in slopes of the first linearly varying phase and the second linearly varying phase.

5. The method, as recited in claim 4, wherein the exciting the first volume and exciting the second volume use a single excitation coil.

6. The method, as recited in claim 4, wherein the exciting the first volume and exciting the second volume use multiple excitation coils.

7. The method, as recited in claim 4, wherein the exciting the first volume and exciting the second volume are performed in rapid succession by separate radio frequency pulses such that phase modulation is achieved by simply modulating the phases of the separate pulses.

8. The method as recited in claim 4, wherein the exciting the first volume and exciting the second volume are performed by a separate set of separate pulses, and the pulses are time-interleaved to excite both slabs, and phase modulation is achieved by modulating the phases of the pulses corresponding to each volume.

9. The method, as recited in claim 4, wherein the exciting the first volume and exciting the second volume use a set of radio frequency pulses using a different cosine modulation to achieve a desired phase modulation during excitation.

10. The method, as recited in claim 4, wherein the exciting the first volume and exciting the second volume use a set of radio frequency pulses designed to produce phase modulation using a Shinnar-LeRoux pulse design algorithm.

11. The method, as recited in claim 4, wherein the first volume is identical to the second volume.

12. The method, as recited in claim 4, wherein the first volume is different than the second volume.

13. The method, as recited in claim 4, wherein phase modulation is provided by a linear function of more than one direction in k-space, such as to effectively shift volumes in more than one direction.

14. The method, as recited in claim 4, wherein the forming the image additionally uses parallel imaging in one or more dimensions.

15. The method, as recited in claim 4, wherein parallel imaging is used to synthesize a field of view that is equal to only the sum of the individual field of views of each slab.

16. The method, as recited in claim 4, wherein the forming the image additionally uses SENSE parallel imaging.

17. The method, as recited in claim 4, wherein the forming the image uses temporal SENSE (TSENSE) imaging.

18. The method, as recited in claim 4, wherein the forming the image uses k-space based parallel imaging such as GRAPPA or SMASH.

19. A magnetic resonance imaging apparatus, comprising:
a magnetic resonance imaging excitation and detection system; and
a controller electrically connected to the magnetic resonance imaging excitation and detection system, comprising:
a display;
at least one processor; and
computer readable media, comprising:
computer readable code for exciting a first volume with a first linearly varying phase with respect to k-space;
computer readable code for exciting a second volume with a second linearly varying phase with respect to k-space, the second volume spaced apart in physical space from the first volume, wherein the first linearly varying phase has a different slope than the second linearly varying phase;
computer readable code for acquiring data in k-space line by line;
computer readable code for Fourier transforming the acquired data in k-space to image space;
computer readable code for forming an image with a first volume image and a second volume image from the transformed data; and
computer readable code for displaying the image on the display.

20. The magnetic resonance imaging apparatus, as recited in claim 19, wherein the first volume forms a first field of view and the second volume forms a second field of view wherein the first field of view and the second field of view are spaced apart by a distance d, wherein the acquired k-space data has a $\Delta k$ that is not dependent on distance d.

* * * * *